United States Patent [19]

Hornbeck et al.

[11] 4,370,622
[45] Jan. 25, 1983

[54] IMD LIMITER

[75] Inventors: Sherman J. Hornbeck, Cedar Rapids, Iowa; Jack C. Thornton, Satellite Beach, Fla.

[73] Assignee: Rockwell International Corporation, El Segundo, Calif.

[21] Appl. No.: 246,455

[22] Filed: Mar. 23, 1981

[51] Int. Cl.³ .................. H03G 3/00; H03G 11/00; H04B 1/04
[52] U.S. Cl. .................. 330/207 P; 455/116; 455/117
[58] Field of Search .......... 455/116, 117, 126; 330/207 P, 298

[56] References Cited

U.S. PATENT DOCUMENTS

| 3,366,883 | 1/1968 | Griffin et al. | 455/116 |
| 3,486,128 | 12/1969 | Lohrmann | 455/126 |
| 4,114,108 | 9/1978 | Haulkenberry et al. | 455/117 |
| 4,147,985 | 4/1979 | Rogers | 455/126 |
| 4,165,493 | 8/1979 | Harrington | 455/116 |

Primary Examiner—Jin F. Ng
Attorney, Agent, or Firm—Richard K. Robinson; Howard R. Greenberg; H. Fredrick Hamann

[57] ABSTRACT

An intermodulation distortion limiter controls the ratio of average power to peak envelope power in the output of a linear power amplifier and this protects against excess non-linearity by reducing the drive power when the ratio exceeds a similar ratio associated with the incoming RF signal.

14 Claims, 3 Drawing Figures

IMD LIMITER

BACKGROUND OF THE INVENTION

This invention relates to intermodulation distortion limiters associated with the linear power amplifier in a radio transmitter.

In the normal operation of a voice/multitone modulated, single or double sideband radio transmitter, the output power amplifier is a linear power amplifier in which the average power output is always less than the peak envelope output power. However, the power amplifier distortion level is measurably heightened if the average power level increases while the peak envelope power level stays constant. Thus, when the prior art amplifier circuits are used, they may be driven into non-linear operation while trying to achieve the rated peak envelope power.

SUMMARY OF THE INVENTION

An intermodulation distortion limiter controls the ratio of average power to peak envelope power in the output of a linear power amplifier and thus, the intermodulation distortion limiter protects against excess non-linearity by reducing the drive power of the power amplifier when the ratio of the output average power to output peak envelope power exceeds a similar ratio associated with the incoming radio frequency signal.

The circuit includes two power detecting circuits. A first circuit is for detecting the input forward power to the linear power amplifier and a second detector circuit detects the output forward power from the power amplifier. The signal that is provided by the first or input power detector is applied to an input peak envelope power sensing circuit and simultaneously to an input average power sensing circuit and the difference between the two sensing circuits is obtained by a difference amplifier that provides, as an output signal, a basic reference voltage signal.

The output forward power that is provided by the power amplifier is applied similarly to two power sensing circuits, an output peak envelope power sensing circuit and an output average power sensing circuit. The output set of sensing circuits senses when the peak envelope power or the average power that is detected by the output forward power detector exceeds established reference levels. The sensed peak envelope power and the sensed average power from the output set of sensing circuits are ORed together and the result is used as an automatic level control for controlling the input signal level to the power amplifier.

In the preferred embodiment, the reference signal level of the input set of sensing circuits is selected to be ground potential whereas there are separate criteria for selecting the two thresholds or reference levels required for the second set of sensing circuits. The reference level that is selected for the output peak envelope power sensing circuit is a DC threshold level selected to limit the maximum level that the output peak envelope power can reach and the reference level for the output averaging sensing circuit is a complex reference signal that is a combination of the basic reference voltage signal, which is the difference between the sensed input peak envelope voltage and the sensed input average voltage, and a DC threshold level selected to limit the maximum level that the output average power can reach.

BRIEF DESCRIPTION OF THE DRAWINGS

The following detailed description will enable the invention to be more fully comprehended. A list of relevant figures accompanies the description in which.

DETAIL DESCRIPTION OF THE PREFERRED EMBODIMENT

Figure 1:
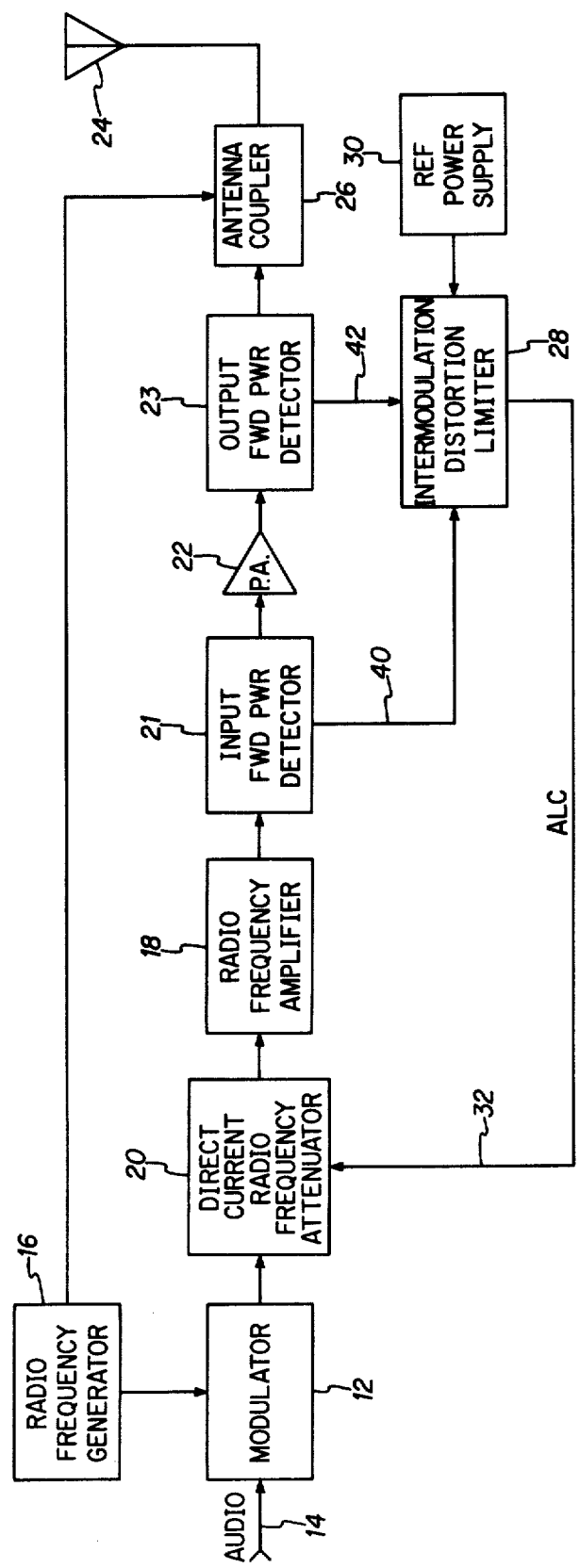
FIG. 1 is a block diagram of a radio transmitter incorporating the intermodulation distortion limiter according to the invention.

In FIG. 1 to which reference should now be made there is illustrated a radio transmitter 10 which receives an input signal such as an audio signal that is applied to a modulator 12 via conductor 14. The modulator 12 mixes the audio signal with a radio frequency signal that is provided by the radio frequency generator 16 and provides as an output an amplitude modulated radio frequency signal to the radio frequency amplifier 18. Interposed electrically between the modulator 12 and the radio frequency amplifier 18 is a radio frequency attenuator which can be controlled by an automatic level control signal which, in the preferred embodiment, is a DC signal and, as such, the attenuator is denoted as a direct current radio frequency attenuator 20. The modulated signal is amplified by the radio frequency amplifier and then applied to the power amplifier 22 after passing through the input forward power detector 21. The output signal of the power amplifier is applied to a load such as an antenna 24 via the output forward power detector 23 and, in the preferred embodiment, an antenna coupler 26. The power that is detected by the input forward power detector 21 and the power that is detected by the output forward power detector 23 is applied to the intermodulation distortion limiter 28 along with a reference signal that is provided by the reference power supply 30 to generate an automatic level control (ALC) signal that is applied via conductor 32 to the direct current radio frequency attenuator 20. It has been found that only the voltage level of the signal that is applied to the power amplifier 22 and also the load or antenna 24 needs to be monitored if there is a constant load or impedance seen by, and also presented by, the power amplifier 22. This is readily accomplished if the antenna coupler 26 is a frequency tuned antenna coupler as in the case of the preferred embodiment, which, thus, insures that the impedance seen by the power amplifier 22 is always constant regardless of the radio frequency provided by the radio frequency generator 16.

Figure 2:
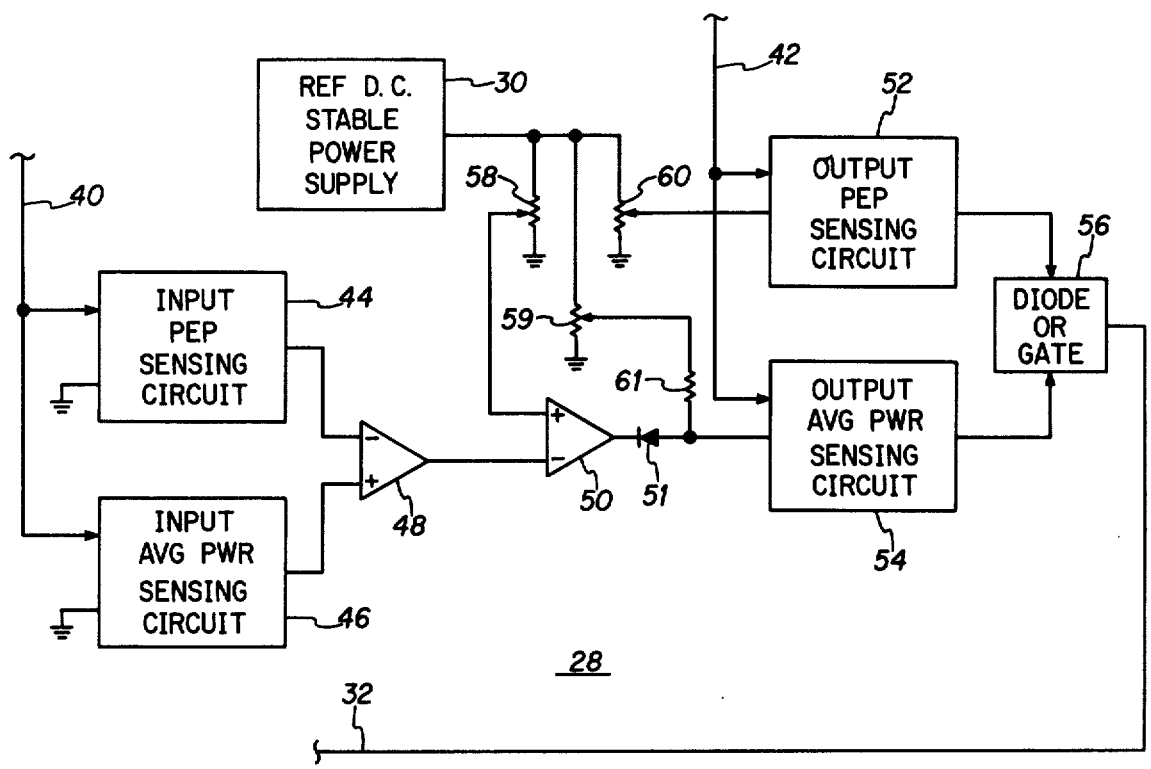
FIG. 2 is a block diagram of the intermodulation distortion limiter according to the invention.

A block diagram of the intermodulation distortion limiter 28 is provided in FIG. 2 in which reference should now be made. An analog representation of the input forward power, as detected by the input forward power detector 21 which may be any of the devices or techniques known in the art (reference may be made to U.S. Pat. No. 3,366,833) including current, or, in the case of the preferred embodiment, voltage level measurement when a constant load is provided (the input impedance of the radio frequency amplifier 22), is applied via conductor 40 to an input peak envelope power sensing circuit 44 and an input average power sensing circuit 46. These circuits compare the detected analog representation that is present on conductor 40 with a reference signal level that will insure a reproduction of half of the modulation envelope.

The distinguishing feature between the peak envelope power sensing circuit and the average sensing circuit is that the input average power sensing circuit 46, although operating in a similar fashion as the input peak envelope power sensing circuit 44, integrates over time the difference between the signal on conductor 40 with an established reference potential and, thus, obtains an analog representation of the average input power. The input peak envelope power sensing circuit 44 only senses the difference between the reference signal level, such as a ground potential and the signal present on conductor 40, and, thus, the envelope of the signal that is applied to the power amplifier 22 is sensed. Difference amplifier 48 obtains the difference between the analog representation of the input average power is provided by the input average power sensing circuit 46 and the analog representation of input peak envelope power as provided by the input peak envelope power sensing circuit 44 to obtain the basic reference voltage signal which is applied to the difference amplifier 50.

The output forward power detector 23 provides an analog signal representative of the detected output power via conductor 42 of FIG. 1 to an output peak envelope power sensing circuit 52 and an output average sensing circuit 54. The output peak envelope power sensing circuit 52 operates in a similar fashion as the input peak envelope power sensing circuit 44 with the exception that the reference signal that is applied to the output peak envelope power sensing circuit 52 is provided in the preferred embodiment by a reference DC stable power supply 30, the level of which is determined by the setting of the potentiometer 60. The setting of the potentiometer 60 is selected to provide a reference or a peak envelope power limit such that an output signal will only be provided when the peak envelope power limit of the power amplifier is exceeded. Similarly, the output average power sensing circuit 54 compares and integrates over time the difference of a signal that represents the detected output power that is present on conductor 42 with the output from potentiometer 59 or the output from difference amplifier 50 (whichever is less) via precision diode 51. (The difference amplifier 50 obtains the difference between a reference level, that is established by the output from the referenced DC stabilized power supply 30 and the potentiometer 58, and the basic reference level that is the output of the difference amplifier 48). The setting of the potentiometer 58 is made to match the expected DC signal on conductor 40 when under laboratory conditions single tone radio frequency drive power is applied to the power amplifier. The resultant DC output voltage from the difference amplifier 50 causes the input radio frequency drive level to adjust such that the ratios of peak envelope-to-average power are equal for both input and output signals. For a power amplifier capable of full peak envelope or average power output, potentiometer 58 prevents degradation of transmitter intermodulation performance by equalizing input and output peak envelope-to-average power ratios at the expense of reduced output power.

The precision diode 51 is a device that acts, as the name implies, as an ideal diode which is normally implemented, as is known in the art, with operational amplifiers. In the case where the rated average power capability of the power amplifier is less than the rated peak envelope power capability of the power amplifier, then the precision diode 51, potentiometer 59 and resistor 61 are used to protect the power amplifier 22 by preventing the output average power from exceeding the maximum power amplifier rating. The potentiometer 59 is set for the equivalent voltage necessary to produce the maximum permitted output average power. The setting of the potentiometers 58 and 60 are selected so that, provided the limit set by potentiometer 59 is not exceeded, the ratio of the peak envelope power to the avarage power of the output signal is equal to the peak envelope power to the average power ratio of the input signal. The diode OR gate 56 selects the output from the output peak envelope power sensing circuit 52 or the output from the average power sensing circuit 54 to provide a signal that will reduce the power amplifier 22 input level if the peak envelope power rating is exceeded (an overdrive condition) and maintains the output signal level at the rated peak envelope power until the overdrive condition is removed. The average power automatic level control as mentioned earlier will control the level of the signal to the radio frequency amplifier such that the power amplifier 22 will not exceed its rated average power level.

Figure 3:
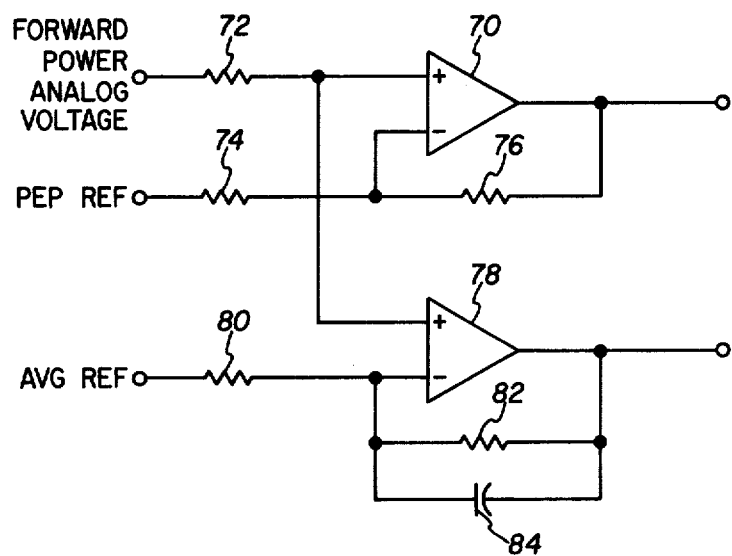
FIG. 3 is a circuit diagram of the peak envelope power sensor and the average power sensing circuits.

FIG. 3 is a circuit diagram of the input peak envelope power sensing circuit 44, the input average power sensing circuit 46, which is in the preferred embodiment identical to the output peak envelope power sensing circuit 52 and the output average power sensing circuit 54. The peak envelope sensing circuits consists of an amplifier 70 that is arranged in a difference amplifier configuration with the detected analog voltage signal that represents the forward power applied to the positive terminal via input offset compensation resistor 72 and the peak envelope power reference signal applied to the negative terminal via resistor 74. The gain of the amplifier 70, of course, is established by the feedback resistor 76. As was mentioned earlier, the average power sensing circuit is an integrating circuit and, consequently, consists of the amplifier 78 with the analog representative of the forward power being applied to the positive terminal via the input offset compensating resistor 72 and the reference signal being applied to the negative terminal via resistor 80. The gain of the amplifier is determined by the feedback impedance that includes the resistor 82 and cpacitor 84 which is also used as the integrating medium for integrating, over time, the voltage difference between the signals that are applied to the positive terminal and the negative terminal of the amplifier 78.

The reason there are separate theseholds for the sensing circuits is that many power amplifiers do not have the capability to operate at full average power; a power amplifier rated for 1 kW peak envelope power may have an average power rating of 500 watts. Thus, the requirements for two separate sensing functions.

In the preferred embodiment, the output forward power detector has a coupling gain that is 10 dB less than the input forward power detector and the gain of the power amplifier is 10 dB. The operation of the embodiment of FIG. 1 may be explained by the comparison of the ratios of the peak envelope power to the average power for multitone operations. The use of multitone signals is for explanatory purposes, since these are normally used in the laboratory evaluation of power amplifiers. The power amplifier 22 is assumed to be driving a constant load such as in the preferred embodiment shown in FIG. 1 and the input and output forward power is represented by a two volt DC analog signal for rated single-tone operation. Under these conditions, the following relationships for different ratios of average to peak envelope power are obtained.

| No. of Tones | Peak Envelope Voltage | Average Voltage | Ratio of Peak Envelope Power to Average Power |
|---|---|---|---|
| 1 | 2.0 | 2.0 | 1.0 |
| 2 | 2.0 | 1.414 | 2.0 |
| 3 | 2.0 | 1.155 | 3.0 |
| 4 | 2.0 | 1.0 | 4.0 |
| 5 | 2.0 | 0.894 | 5.0 |

Assuming for this example that rated peak envelope and average power output levels are equal, the effects of potentiometer 59, resistor 61 and precision diode 51 may be eliminated by adjusting potentiometer 59 for a DC voltage output greater than that of potentiometer 58.

The threshold reference voltages for the output average and peak envelope power sensing circuits are assigned a 2 volt DC level (equivalent to the rated ratio frequency power output levels.) Thus, overdrive with a single-tone input will cause both automatic level control thresholds to be exceeded simultaneously. The gain of the difference amplifiers, 48 and 50, is selected to be unity and, therefore, the equation for the output average sensing circuit reference voltage is:

$$REF_{(avg)} = 2 + (VAVG_{(in)} - VPEP_{(in)}) = 2 + VAVG_{(in)} - 2 = VAVG_{(in)}$$

Where $VAVG_{(in)}$ is the input voltage that represents the input average power, $VPEP_{(in)}$ is the input voltage that represents the input peak envelope power. The power amplifier will thus cause the automatic level control voltage to limit the drive level whenever the average power analog voltage of the output forward power detector exceeds the referenced voltage level of the average sensing circuit. The DC voltage gains of the output sensing circuits are set for the desired automatic level control loop gain characteristics.

Depending upon the modulation type, the average power of the power amplifier will be limited to less than the threshold preset by the average power limiter (the output of amplifier 50). The reference level to the output average power sensing circuit derives its information through the difference amplifier 50. When the output signal from the radio frequency amplifier 18 of FIG. 1 contains no amplitude component of modulation, the peak envelope power and average power are equal. The difference amplifier output is thus zero volts ($VAVG_{(in)} - VPEP_{(in)}$ = zero) and the reference voltage is equal to the average power limit voltage that is set by the potentiometer 58. With increased amplitude modulation or number of tones in the output of the radio frequency amplifier, the ratio of the average power to the peak envelope power decreases and the output of the difference amplifier 48 changes in a negative direction for the configuration illustrated in FIGS. 2 and 3. The reference voltage to the output average power sensing circuit 54 thus changes to reduce the automatic level control threshold and generate an automatic level control voltage or current for less average power in the output waveform. The ratio of the average power to the peak envelope power is then adjusted in response to the automatic level control voltage from the average sensing circuit, the peak envelope power output being limited by the peak envelope power sensing circuit.

Many changes and modifications in the above described embodiment of the invention can, of course, be carried out without departing from the scope thereof. Accordingly, to promote the process in science and the useful arts, the invention is disclosed and is intended to be limited only by the scope of the appended claims.

We claim:

1. An intermodulation distortion limiter for controlling the ratio of average power to peak envelope power in an output signal from a power amplifier comprising:
   control means, responsive to a control signal, for controlling the amplitude of an input signal applied to the power amplifier, the input signal having associated therewith, when applied to the power amplifier, an average power and a peak envelope power;
   first detector circuit means for detecting the difference between the peak envelope power and the average power of the input signal to provide a first reference signal thereby;
   selectable reference source for providing first and second selectable reference signals:
   reference generator means for generating a second reference signal that is responsive to the first reference signal and the first selectable reference signal;
   second detector circuit means for comparing the peak envelope power of the output signal and the second selectable reference signal to obtain a first analog representation of the peak envelope power difference thereby;
   third detector circuit means for detecting the difference between the average power of the output signal and the second reference signal to obtain a second analog representation of the average power difference; and
   combination means for combining the first and second analog representations to obtain the control signal to which the control means is responsive.

2. The intermodulation distortion limiter according to claim 1 wherein the first detector circuit means comprises:
   input power detector means for detecting a first signal that represents the input forward power applied to the power amplifier;
   an input peak envelope power circuit means for obtaining a second signal that represents the difference between the peak envelope power of the first signal and a reference potential;
   an average power sensing circuit means for integrating over time the difference between the first signal and reference potential to obtain a third signal thereby; and
   a difference amplifier means for obtaining the difference between the second and the third signals to provide the first reference signal.

3. The intermodulation distortion limiter according to claim 1 wherein the reference generator means, comprises:
   a comparator means for obtaining the difference between the first reference signal and the first selectable reference signal to obtain the second reference signal thereby.

4. The intermodulation distortion limiter according to claim 1 wherein the second detector means comprises:

detector means for detecting a fourth signal that represents the output forward power of the power amplifier; and comparator means for obtaining the difference between the second selectable reference signal and the fourth signal to obtain the first analog representation.

5. The intermodulation distortion limiter according to claim 1 wherein the third detector circuit means comprises:

detector means for detecting a fourth signal that represents the output forward power of the power amplifier; and integrator means for integrating over time the difference between the fourth signal and the second reference signal to obtain the second analog representation.

6. The intermodulation distortion limiter according to claim 1 or 5 wherein the reference generator means further comprising:

protection circuit means for protecting the power amplifier.

7. The intermodulation distortion limiter according to claim 6 wherein the protection circuit means comprises;

means for generating a third selectable reference signal; and precision diode means for preventing the second reference signal from exceeding the third selectable reference signal.

8. A method of controlling the ratio of average power to peak envelope in an output signal from a power amplifier, comprising:

controlling the amplitude of an input signal applied to the power amplifier in response to a control signal, the input signal having associated therewith, when applied to the power amplifier, an average power and a peak envelope power;

detecting the difference between the peak envelope power and the average power of the input signal to provide a first reference signal;

providing a first and second selectable reference signal;

generating a second reference signal that is in response to the first reference signal and the first selectable reference signal;

detecting the difference between the peak envelope power of the output signal and the second selectable reference signal to obtain a first analog representation of the peak envelope power difference;

detecting the difference between the average power of the output signal and the second reference signal to obtain a second analog representation of the average power difference; and combining the first and second analog representations to obtain the control signal.

9. The method according to claim 8 wherein the step of detecting the difference between the peak envelope power and the average power to provide a first reference signal, comprises:

detecting a first signal that represents the input forward power to the applied power amplifier;

obtaining a second signal that represents the difference between the peak envelope power of the first signal and a reference potential;

integrating over time of the difference between the first signal and a reference potential to obtain a third signal thereby; and obtaining the difference between the second signal and the third signal to provide the first reference signal.

10. The step according to claim 8 wherein the step of generating a second reference signal, comprises:

obtaining the difference between the first reference signal and the first selectable reference signal to obtain the second reference signal thereby.

11. The method according to claim 8 wherein the step of detecting the difference between the peak envelop power of the output signal and the first selectable reference signal, comprises:

detecting a fourth signal that represents the output forward power of the power amplifier; and obtaining the difference between the second selectable reference signal and the fourth signal to obtain the first analog representation.

12. The method according to claim 8 wherein the step of detecting the difference between the average power of the output signal and the second reference signal to obtain the analog representation of the average power difference, comprises:

detecting a fourth signal that represents the output forward power of the power amplifier; and integrating over time the difference between the first signal and the second reference signal to obtain the second analog representation.

13. The method according to claim 8 or 12 wherein the step of generating a second reference signal comprises the step of:

protecting the power amplifier.

14. The method according to claim 13 wherein the step of protecting the power amplifier comprises:

generating a third selectable reference signal; and preventing a second reference signal from exceeding the third selectable reference signal.

* * * * *